(12) United States Patent
Craig et al.

(10) Patent No.: US 7,308,663 B2
(45) Date of Patent: Dec. 11, 2007

(54) CIRCUIT DESIGN VERIFICATION USING CHECKPOINTING

(75) Inventors: Jesse E. Craig, South Burlington, VT (US); Jason M. Norman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 11/162,846

(22) Filed: Sep. 26, 2005

(65) Prior Publication Data

US 2007/0074135 A1    Mar. 29, 2007

(51) Int. Cl.
*G06F 17/50*   (2006.01)
*G06G 7/62*    (2006.01)
(52) U.S. Cl. ............................................ 716/5; 703/13
(58) Field of Classification Search .................. 716/4–5; 703/13–14
See application file for complete search history.

(56) References Cited

U.S. PATENT DOCUMENTS

| | | | |
|---|---|---|---|
| 4,745,355 A | 5/1988 | Eichelberger et al. | |
| 5,920,490 A | 7/1999 | Peters | |
| 6,363,509 B1 | 3/2002 | Parulkar et al. | |
| 6,857,108 B2* | 2/2005 | Hamlin | 716/2 |
| 6,931,611 B2* | 8/2005 | Martin et al. | 716/5 |
| 7,051,303 B1* | 5/2006 | Lam et al. | 716/4 |
| 2003/0061581 A1 | 3/2003 | Baumgartner et al. | |
| 2004/0059977 A1 | 3/2004 | Liau | |
| 2005/0193280 A1* | 9/2005 | Schubert et al. | 714/47 |
| 2006/0085774 A1* | 4/2006 | Moorby | 716/5 |

* cited by examiner

*Primary Examiner*—Stacy Whitmore
(74) *Attorney, Agent, or Firm*—Schmeiser, Olsen & Watts; Michael J. LeStrange

(57) ABSTRACT

A design verification method, comprising providing a circuit design; creating a stimulus tree diagram for the circuit design, wherein the stimulus tree diagram comprises L stimuli, M checkpointed splits, and N non-checkpointed splits; and executing the stimulus tree diagram, wherein said executing the stimulus tree diagram comprises, for i=1, ..., M, executing an $i^{th}$ checkpointed split of the M checkpointed splits, wherein said executing the $i^{th}$ checkpointed split comprises (a) saving an $i^{th}$ context of an $i^{th}$ simulation environment in which said executing the stimulus tree diagram is performed; and (b) after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

34 Claims, 6 Drawing Sheets

```
                        500 stimulus_generator
        begin
        S; A;
        if_random_boolean()=TRUE  ←———— 510
            B; C; D; E;
        else
            F;
            fork_random_boolean (TRUE, FALSE)  ←———— 320
                G;I:
                    if_random_boolean()=TRUE  ←———— 530
                        L;
                    else
                        M;
                else
                    H;
                    if_random_boolean()=TRUE  ←———— 540
                        J;
                    else
                        K; N;
        end
```

300

```
stimulus_generator
begin
S; A;
fork_random_boolean (TRUE, FALSE)  ←──────── 310
    B; C; D; E;
else
    F;
    fork_random_boolean (TRUE, FALSE) ←──── 320
        G;I;
        fork_random_boolean (TRUE, FALSE) ←── 330
            L;
        else
            M;
    else
        H;
        fork_random_boolean (TRUE, FALSE) ←── 340
            J;
        else
            K; N;
end
```

FIG. 3

```
stimulus_generator
begin
S; A;
if_random_boolean()=TRUE                    ←——————— 510
        B; C; D; E;
else
        F;
        fork_random_boolean (TRUE, FALSE)   ←——————— 320
                G;I:
                if_random_boolean()=TRUE    ←——————— 530
                        L;
                else
                        M;
        else
                H;
                if_random_boolean()=TRUE    ←——————— 540
                        J;
                else
                        K; N;
end
```

FIG. 5

CIRCUIT DESIGN VERIFICATION USING CHECKPOINTING

BACKGROUND OF THE INVENTION

1. Technical Field

The present invention relates to circuit design verification, and more specifically, to circuit design verification using checkpointing.

2. Related Art

A circuit design after being created is usually verified (i.e., tested) before being actually fabricated. Typically, the circuit design is verified by running a simulation program on a computer (not shown) during which different inputs (called stimuli) are in turn applied to the circuit design and the signals at the outputs and different nodes of the circuit design are collected and compared with expected values. If a mismatch occurs, the circuit design is considered defective and must be re-designed. The number of different stimuli may be extremely large and, as a result, testing the circuit design with all possible stimuli would take a very long time. Therefore, there is a need for a method for verifying the circuit design in relatively less time than in the prior art.

SUMMARY OF THE INVENTION

The present invention provides a design verification method, comprising providing a circuit design; creating a stimulus tree diagram for the circuit design, wherein the stimulus tree diagram comprises L stimuli, L being an integer greater than 4, wherein the stimulus tree diagram further comprises M checkpointed splits, M being an integer greater than 1, and wherein the stimulus tree diagram further comprises N non-checkpointed splits, N being an non-negative integer; and executing the stimulus tree diagram, wherein said executing the stimulus tree diagram comprises, for i=1, . . . , M, executing an $i^{th}$ checkpointed split of the M checkpointed splits, wherein said executing the $i^{th}$ checkpointed split comprises saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

The present invention also provides a method, comprising executing an algorithm by a processor of a computer system, said algorithm being comprised by a computer code stored in a computer-readable media, said computer-readable media being coupled to the processor, said executing said algorithm comprising the step of executing a stimulus tree diagram of a circuit design, wherein the stimulus tree diagram comprises L stimuli, L being an integer greater than 4, wherein the stimulus tree diagram further comprises M checkpointed splits, M being an integer greater than 1, wherein the stimulus tree diagram further comprises N non-checkpointed splits, N being an non-negative integer, and wherein said executing the stimulus tree diagram comprises, for i=1, . . . , M, executing an $i^{th}$ checkpointed split of the M checkpointed splits, wherein said executing the $i^{th}$ checkpointed split comprises saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

The present invention also provides a computer program product, comprising a computer usable medium having a computer readable program code embodied therein, said computer readable program code comprising an algorithm adapted to implement a method for circuit design verification, said method comprising the step of executing a stimulus tree diagram of a circuit design, wherein the stimulus tree diagram comprises L stimuli, L being an integer greater than 4, wherein the stimulus tree diagram further comprises M checkpointed splits, M being an integer greater than 1, wherein the stimulus tree diagram further comprises N non-checkpointed splits, N being an non-negative integer, and wherein said executing the stimulus tree diagram comprises, for i=1, . . . , M, executing an $i^{th}$ checkpointed split of the M checkpointed splits, wherein said executing the $i^{th}$ checkpointed split comprises saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

The present invention also provides a method for circuit design verification, comprising integrating computer-readable code into a computing system, wherein the code in combination with the computing system is capable of performing the step of executing a stimulus tree diagram of a circuit design, wherein the stimulus tree diagram comprises L stimuli, L being an integer greater than 4, wherein the stimulus tree diagram further comprises M checkpointed splits, M being an integer greater than 1, wherein the stimulus tree diagram further comprises N non-checkpointed splits, N being an non-negative integer, and wherein said executing the stimulus tree diagram comprises, for i=1, . . . , M, executing an $i^{th}$ checkpointed split of the M checkpointed splits, wherein said executing the $i^{th}$ checkpointed split comprises saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

The present invention provides a method of testing an integrated circuit using a concurrent simulation process, the method comprising defining a test coverage for the integrated circuit; creating a first simulation process from a random seed configuration of the integrated circuit, the first simulation process controlling the concurrent simulation process; running the first simulation process to a first checkpointed split of the test coverage; running a second simulation process concurrently with the first simulation process, the second simulation process starting at the first checkpointed split; continuing the first simulation process to a first plurality of checkpointed splits until all stimuli on a coverage path of the test coverage have been exercised; continuing the second simulation process to a second plurality of checkpointed splits until all stimuli on a coverage path of the test coverage have been exercised; and communicating a status and a location of each one of the first plurality of checkpointed splits and the second plurality of checkpointed splits to the first simulation process.

The present invention provides a method for verifying the circuit design in relatively less time than in the prior art.

BRIEF DESCRIPTION OF THE DRAWINGS

FIG. 3 illustrates a stimulus program for implementing the stimulus tree diagram of FIG. 2, in accordance with embodiments of the present invention.

FIG. 5 illustrates another stimulus program for implementing the stimulus tree diagram of FIG. 2, in accordance with embodiments of the present invention.

DETAILED DESCRIPTION OF THE INVENTION

Figure 1:
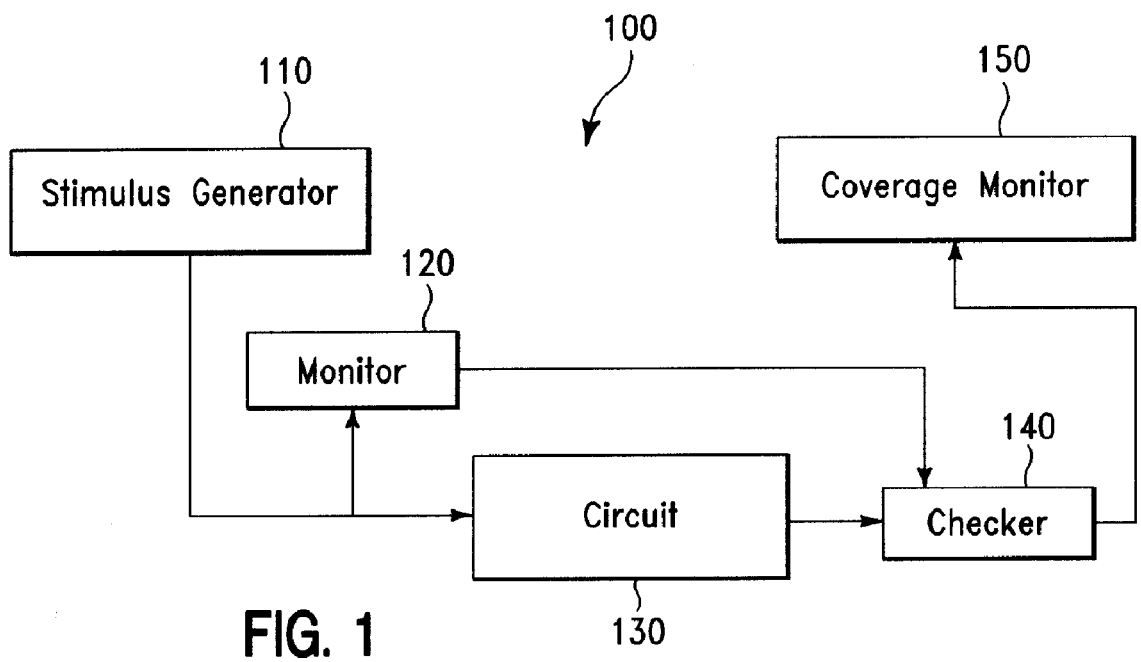
FIG. 1 illustrates a testing system (testing simulation environment), in accordance with embodiments of the present invention.

FIG. 1 illustrates a testing system 100 for verifying (i.e., testing) a circuit 130, in accordance with embodiments of the present invention. More specifically, in one embodiment, the verification of the circuit 130 proceeds as follows. A stimulus generator 110 generates a stimulus to the circuit 130 and to a monitor 120. The circuit 130 receives as input the stimulus from the stimulus generator 110 and generates an output signal to a checker 140. The monitor 120 records the stimulus given to the circuit 130. In one embodiment, the monitor 120 converts the stimulus into a useful form before sending it to the checker 140. The checker 140 calculates an expected result from the information provided by the monitor 120 and compares the output signal from the circuit 130 and the calculated expected result. Any difference between the output signal from the circuit 130 and the calculated expected result indicates a potential error in the circuit 130.

In one embodiment, the checker 140 also keeps track of whether the circuit 130 has been tested with a pre-specified set of stimuli (called a stimulus coverage path) and notifies a coverage monitor 150 accordingly. The coverage monitor 150 keeps track of the stimulus coverage paths performed on the circuit 130 and compares the performed stimulus coverage paths with a pre-specified set of stimulus coverage paths (called the stimulus coverage goal). In one embodiment, when all the stimulus coverage paths of the stimulus coverage goal have been performed, the coverage monitor 150 signifies the verification engineer so that the verification engineer can stop the verification process.

In one embodiment, the verification of the circuit 130 is simulated by executing a simulation program in a computer (not shown). More specifically, the stimulus generator 110, the monitor 120, the circuit 130, the checker 140, and the coverage monitor 150 are all simulated by executing the simulation program in the computer. As a result, in the context of computer simulation, the circuit 130 can be referred to as the circuit design 130, and the testing system 100 can be referred to as the testing simulation environment 100. Also, in the context of computer simulation, the stimulus generator 110, the monitor 120, the checker 140, and the coverage monitor 150 can be referred to as the stimulus generator process 110, the monitor process 120, the checker process 140, and the coverage monitor process 150, respectively.

It should be noted that multiple testing simulation environments similar to the testing simulation environment 100 can be simulated sequentially or simultaneously by executing the simulation program in the computer.

Figure 2:
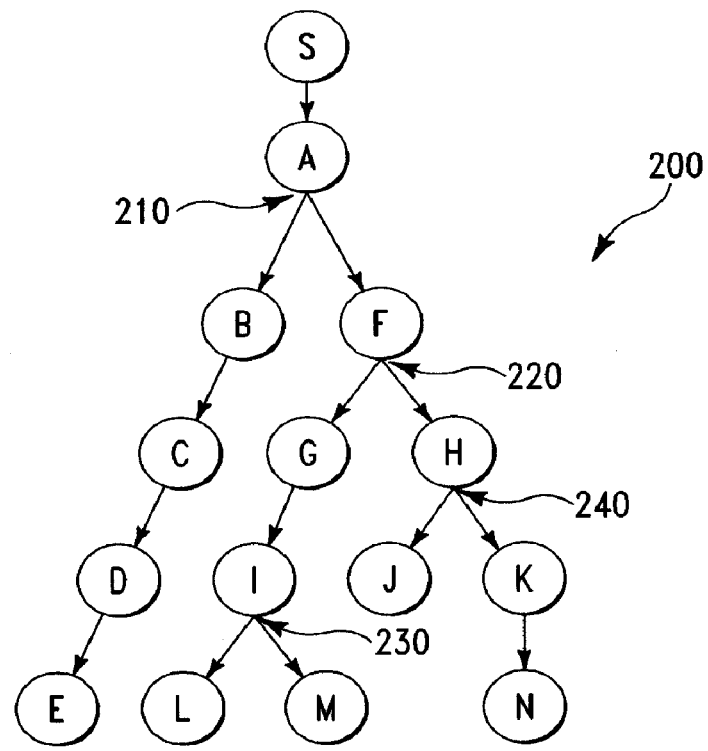
FIG. 2 illustrates a stimulus tree diagram for a stimulus generator of the testing simulation environment of FIG. 1, in accordance with embodiments of the present invention.

FIG. 2 illustrates a stimulus tree diagram 200 for the stimulus generator process 110 of FIG. 1, in accordance with embodiments of the present invention. The stimulus tree diagram 200 can be created to verify the circuit design 130. For illustration, the stimulus tree diagram 200 comprises 15 circles representing 15 stimuli, namely, stimuli S, A, B, C, . . . , and N.

For illustration, assume that the circuit design 130 is a sequential digital circuit that has two binary inputs X and Y (not shown) and one binary output Z (not shown). As a result, as an example, root stimulus S can be (1, 1) that can be applied to inputs X and Y, respectively (i.e., X=1 and Y=1). Stimulus A can be (1, 0) that can be applied to inputs X and Y, respectively (i.e., X=1 and Y=0). Stimulus B can be (0, 0) that can be applied to inputs X and Y, respectively (i.e., X=0 and Y=0). Stimulus C can be again (1, 0) (i.e., identical to stimulus A) that can be applied to inputs X and Y, respectively (i.e., X=1 and Y=0), and so on.

The arrow from stimulus A to stimulus B indicates that stimulus A is applied to the circuit design 130 before stimulus B. Similarly, the arrow from stimulus A to stimulus F indicates that stimulus A is applied to the circuit design 130 before stimulus F, and so on for other arrows in the stimulus tree diagram 200.

When all six stimuli S, A, B, C, D, and E have been in turn applied to the circuit design 130 in that order, it is said that the stimulus coverage path S-A-B-C-D-E has been performed and that a test run has been performed. Similarly, when all five stimuli S, A, F, H, and J have been in turn applied to the circuit design 130 in that order, it is said that the stimulus coverage path S, A, F, H, and J has been performed and that a test run has been performed, and so on.

The stimulus tree diagram 200 comprises 5 different stimulus coverage paths: S-A-B-C-D-E, S-A-F-G-I-L, S-A-F-G-I-M, S-A-F-H-J, and S-A-F-H-K-N. When all the five stimulus coverage paths have been performed, it is said that the stimulus coverage goal of the verification of the circuit design 130 has been achieved. As a result, at least 5 test runs must be performed to achieve the stimulus coverage goal. It can be seen that each of the five stimulus coverage paths starts with sequence S-A. As a result, the sequence S-A can be referred to as the initialization sequence.

It should be noted that the stimulus tree diagram 200 can be just a portion of a much larger stimulus coverage space. For example, stimulus sequences S-A-A and S-A-B-A (not shown) are two possible stimulus coverage paths of the stimulus coverage space but do not belong to the stimulus tree diagram 200. This may be because the verification engineer chooses not to test the circuit design 130 along these two stimulus coverage paths. The reason the verification engineer does so may be because the circuit design 130 is not designed to execute along these two stimulus coverage paths. In other words, in the embodiments above, the stimulus tree diagram 200 comprises only a portion of the stimulus coverage space. In an alternative embodiment, the stimulus tree diagram 200 comprises the entire stimulus coverage space.

FIG. 3 illustrates a stimulus program 300 for implementing the stimulus tree diagram 200 of FIG. 2, in accordance with embodiments of the present invention. In one embodiment, the stimulus program 300 can be included in the simulation program for creating the testing simulation environment 100 of FIG. 1. In the stimulus program 300, letter "A" followed by a ";" represents a computer instruction A which when executed simulates the generation of stimulus A to the circuit design 130 (FIG. 1). This is followed by the operation of the testing simulation environment 100 (FIG. 1) in response to stimulus A being generated and applied to the circuit design 130 (FIG. 1). More specifically, this operation comprises simulating the generation of an output signal by the circuit design 130 in response to stimulus A, simulating the operation of the monitor 120 in forwarding stimulus A to the checker 130, simulating the operation of the checker 140 in comparing the output of the circuit design 130 in response to stimulus A and an expected value, etc.

Illustratively, the stimulus program 300 has four fork_random_boolean instructions 310, 320, 330, and 340 each of which when executed by the computer causes a checkpointing event (described in details later). There are four splits 210, 220, 230, and 240 in the stimulus tree diagram 200 (FIG. 2) right after stimuli A, F, I, and H, respectively, and the four fork_random_boolean instructions 310, 320, 330, and 340 corresponds to the four splits 210, 220, 230, and 240, respectively (FIG. 2). The execution of the stimulus program 300 will be discussed later.

Figure 4:
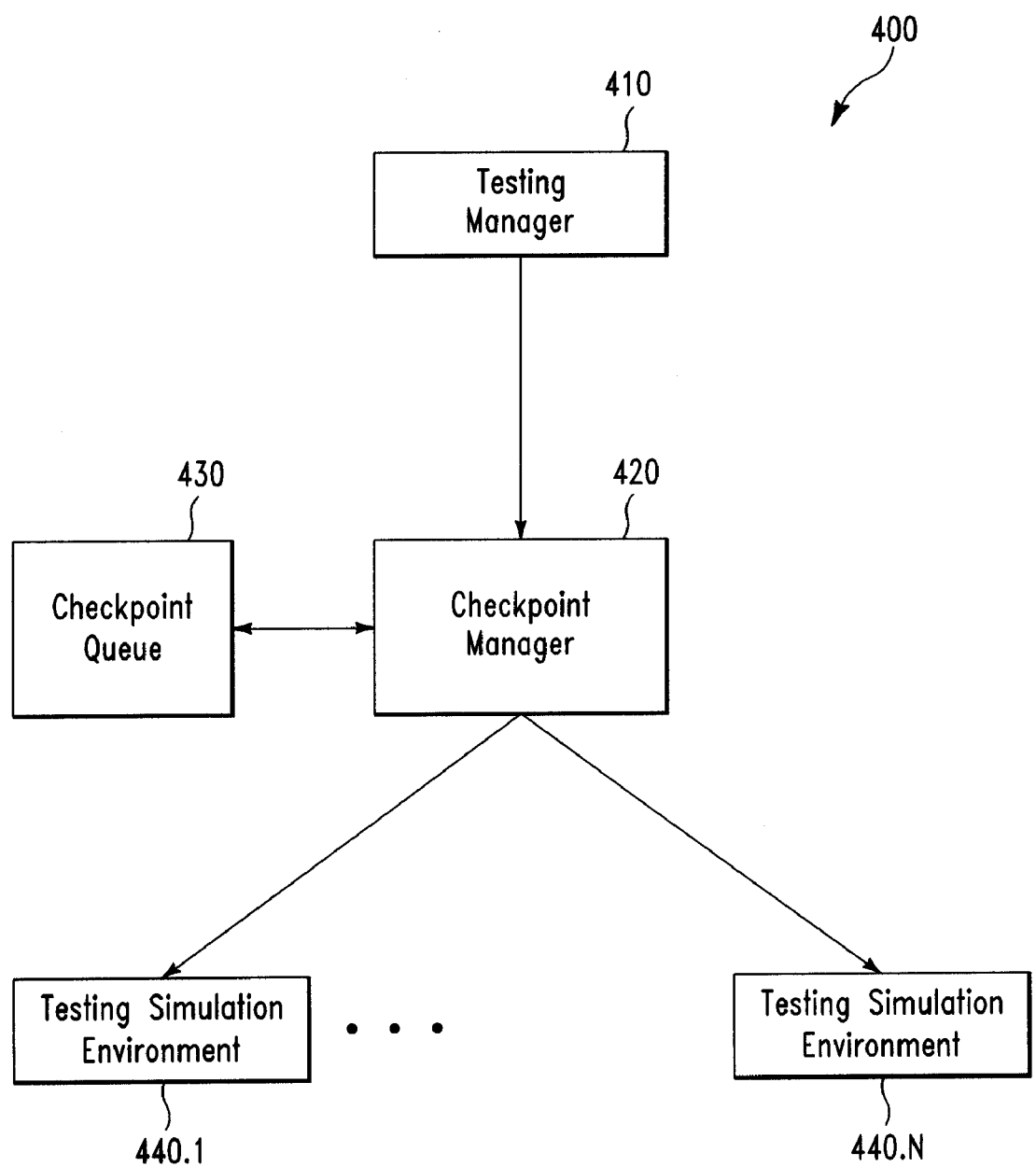
FIG. 4 illustrates a verification environment utilizing the testing simulation environment of FIG. 1, in accordance with embodiments of the present invention.

FIG. 4 illustrates a verification environment 400 utilizing the testing simulation environment 100 of FIG. 1, in accordance with embodiments of the present invention. More specifically, the verification environment 400 comprises a testing manager 410, a checkpoint manager 420, a checkpoint queue 430, and N testing simulation environments 440.1, . . . , 440.N, wherein N is a positive integer. Each of the N testing simulation environments 440.1, . . . , 440.N is similar to the testing simulation environment 100 of FIG. 1.

In one embodiment, the verification environment 400 is created by executing the simulation program by the computer. This means that the testing manager 410 and the checkpoint manager 420 are also computer processes.

With reference to FIGS. 1-4, in one embodiment, the verification of the circuit design 130 is performed in the verification environment 400 using the stimulus program 300 (called executing the stimulus program 300) as follows. First, the testing manager 410 executes the simulation program up to the point immediately before the stimulus program 300. Then, the testing manager 410 transfers control to the checkpoint manager 420. In response, checkpoint manager 420 forks (i.e., creates) a first testing simulation environment 440.1 (FIG. 4) which starts executing at the very start of the stimulus program 300 (FIG. 3). More specifically, the testing simulation environment 440.1 executes instruction S, then instruction A, and then the fork_random_boolean instruction 310.

In one embodiment, when executing the fork_random_boolean instruction 310 (called executing the checkpointed split 210 of FIG. 2), the testing simulation environment 440.1 performs the following. First, the testing simulation environment 440.1 notifies the checkpoint manager 420 that the testing simulation environment 440.1 is checkpointing at the fork_random_boolean instruction 310. Next, the testing simulation environment 440.1 provides the checkpoint manager 420 the two possible outcomes of the fork_random_boolean instruction 310, namely, TRUE and FALSE (which are listed in the fork_random_boolean instruction 310). Next, the testing simulation environment 440.1 saves its context and then terminates.

In one embodiment, in response to receiving the two possible outcomes TRUE and FALSE of the fork_random_boolean instructions 310 from the testing simulation environment 440.1, the checkpoint manager 420 saves the two possible outcomes TRUE and FALSE as first and second items in the checkpoint queue 430, respectively. Illustratively, the first item can be "TRUE-instruction A" and the second item can be "FALSE-instruction A".

In one embodiment, the checkpoint manager 420 keeps checking the checkpoint queue 430 for available items and finds that the checkpoint queue 430 contains the first and second items. Then, the checkpoint manager 420 forks a second testing simulation environment 440.2 and gives the first item of the checkpoint queue 430 (i.e., "TRUE-instruction A") to the testing simulation environment 440.2. Here, it is assumed that the checkpoint queue 430 is operated on a FIFO (first-in-first-out) basis. That is, the first item is put in the checkpoint queue 430 before the second item, and therefore, the first item is acted upon before the second item.

Next, in response, the testing simulation environment 440.2 starts from the context saved by the testing simulation environment 440.1 and executes instructions B, C, D, and E, and then terminates (i.e., following the TRUE path). At this point, the stimulus coverage path S-A-B-C-D-E has been performed and a test run is finished.

Next, in one embodiment, the checkpoint manager 420 checks the checkpoint queue 430 and finds that the checkpoint queue 430 still contains the second item (i.e., "FALSE-instruction A"). Then, the checkpoint manager 420 forks a third testing simulation environment 440.3 and gives the second item of the checkpoint queue 430 to the testing simulation environment 440.3.

Next, in response, the testing simulation environment 440.3 starts from the context saved by the testing simulation environment 440.1 and executes instruction F and then the fork_random_boolean instruction 320 (i.e., following the FALSE path), and then terminates.

In one embodiment, the testing simulation environment 440.3 performs the fork_random_boolean instructions 320 in a manner similar to the manner in which the testing simulation environment 440.1 performs the fork_random_boolean instructions 310. As a result, the checkpoint queue 430 again has third and fourth items: "TRUE-instruction F" and "FALSE-instruction F", respectively.

Next, in response to finding the third and fourth items in the checkpoint queue 430, the checkpoint manager 420 forks (i) a fourth testing simulation environment 440.4 to execute instruction G (i.e., follow the TRUE path) and (ii) a fifth testing simulation environment 440.5 to execute instruction H (i.e., follow the FALSE path), and so on until all five stimulus coverage paths S-A-B-C-D-E, S-A-F-G-I-L, S-A-F-G-I-M, S-A-F-H-J, and S-A-F-H-K-N are tested. In one embodiment, the testing manager 410 running in the background recognizes this condition (i.e., all five stimulus coverage paths of the stimulus coverage goal are tested) and then indicates that the verification process is complete.

In the embodiments described above, the checkpoint manager 420 forks a new testing simulation environment only after all the previously-created testing simulation environments terminate (i.e., sequentially). For instance, the checkpoint manager 420 forks the third the testing simulation environment 440.3 after the second testing simulation environment 440.2 terminates. In an alternative embodiment, the checkpoint manager 420 can fork a new testing simulation environment even if other previously created testing simulation environments are still executing. For example, while the second testing simulation environment 440.2 is executing along the TRUE path (i.e., the stimulus coverage path S-A-B-C-D-E), the checkpoint manager 420 can fork the third testing simulation environment 440.3 to execute along the FALSE path (i.e., instruction F). In another example, while the second testing simulation environment 440.2 is executing along the TRUE path (i.e., the stimulus coverage path S-A-B-C-D-E) and after the third testing simulation environment 440.3 has terminated, the checkpoint manager 420 can fork the fourth and fifth testing simulation environment 440.4 and 440.5 to execute along the TRUE path (i.e., instruction G) and the FALSE path (i.e., instruction H), respectively.

In the embodiments described above, one fork_random_boolean instruction is used for each split in the stimulus tree diagram 200. More specifically, the four fork_random_boolean instructions 310, 320, 330, and 340 (FIG. 4) are used for the four splits 210, 220, 230, and 240, respectively (FIG. 2). In other words, all splits in the stimulus tree diagram 200 are checkpointed splits. Alternatively, not all the splits in the stimulus tree diagram 200 are checkpointed splits (i.e., there can be only one, two, or three checkpoints in the stimulus tree diagram 200. For instance, there can be only one checkpoint at the split 220 (called non-checkpointed split 220). This corresponds to replacing the three fork_random_boolean instructions 310, 330, and 340 with three "if_random_boolean( )=TRUE" instructions in the stimulus program 300, resulting in the stimulus program 500 (FIG. 5).

With reference to FIGS. 1-5, in one embodiment, the verification of the circuit design 130 using the stimulus program 500 (called executing the stimulus program 500) is similar to executing the stimulus program 300, except the following aspects. In one of such aspects, when executing any of the "if_random_boolean( )=TRUE" instructions 510, 530, and 540 of the stimulus program 500 (FIG. 5), a testing simulation environment performs the following. First, the testing simulation environment generates a random boolean value of either TRUE or FALSE. Then, based on the randomly generated value, the testing simulation environment will execute along the corresponding path.

For instance, assume that the testing simulation environment is executing the "if_random_boolean( )=TRUE" instruction 510 (FIG. 5). If the randomly generated value generated by the testing simulation environment is TRUE, then the testing simulation environment will execute along the TRUE path (i.e., stimulus coverage path B-C-D-E). If the randomly generated value generated by the testing simulation environment is FALSE, then the testing simulation environment will execute the FALSE path (i.e., executing instruction F and then the fork_random_boolean instruction 320). The testing simulation environment will execute the fork_random_boolean instruction 320 of the stimulus program 500 (FIG. 5) in a manner similar to the manner in which the testing simulation environment 440.1 executes the fork_random_boolean instruction 310 (FIG. 3) described above.

In one embodiment, multiple testing simulation environments can sequentially or non-sequentially execute the stimulus program 500 (FIG. 5) along a same or different stimulus coverage paths of the stimulus tree diagram 200 (FIG. 2). As an example of non-sequential execution, assume that at one moment, one testing simulation environment which was created by the testing manager 410 and started from instruction S is executing instruction C (this testing simulation environment generated a TRUE value while executing the "if_random_boolean( )=TRUE" instruction 510 right after instruction A and hence followed the TRUE path).

At the same moment, another testing simulation environment which was created by the testing manager 410 and started from instruction S is executing instruction E (this testing simulation environment also generated a TRUE value while executing the "if_random_boolean( )=TRUE" instruction 510 right after instruction A and hence followed the same TRUE path).

At the same moment, yet another testing simulation environment which was created by the checkpoint manager 420 and started from instruction G is executing instruction I (this testing simulation environment was given a TRUE item from the checkpoint queue 430 (FIG. 4) by the checkpoint manager 420 and hence followed the TRUE path to instruction I).

At the same moment, yet another testing simulation environment which was created by the checkpoint manager 420 and started from instruction H is executing instruction K (this testing simulation environment was given a FALSE item from the checkpoint queue 430 by the checkpoint manager 420 and hence followed the FALSE path, and then generated a FALSE value while executing the "if_random_boolean( )=TRUE" instruction 540 right after instruction H and hence followed the FALSE path to instruction K).

In one embodiment, if the stimulus coverage goal is not yet achieved, then the testing manager 410 keeps creating new testing simulation environments that start executing from instruction S of the stimulus program 500 (FIG. 5).

Figure 6:
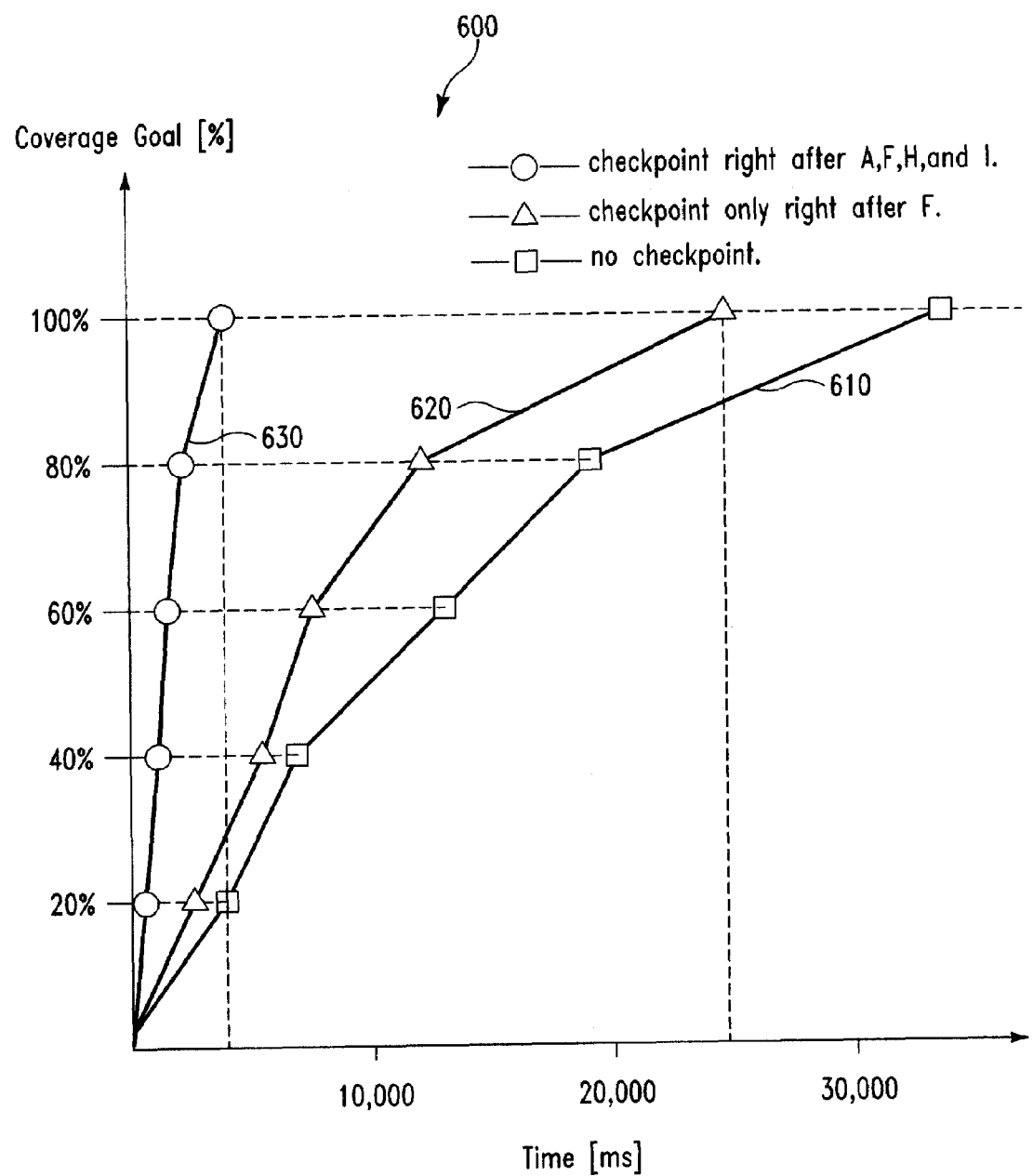
FIG. 6 illustrates the advantage of checkpointing using the verification environment of FIG. 4, in accordance with embodiments of the present invention.

FIG. 6 shows a plot 600 that illustrates the advantage of checkpointing using the verification environment 400 of FIG. 4, in accordance with embodiments of the present invention. More specifically, the line 610 represents the case in which no checkpoint is used in the stimulus tree diagram 200 (FIG. 2). In other words, the stimulus program used in this case is similar to the stimulus program 300 (FIG. 3) except that all the four fork_random_boolean instructions 310, 320, 330, and 340 are replaced by four "if_random_boolean( )=TRUE" instructions. The line 620 represents the case in which only one checkpoint is present at the split 220 in the stimulus tree diagram 200 (FIG. 2). In other words, the stimulus program 500 (FIG. 5) is used. The line 630 represents the case in which checkpoints are present at all four splits 210, 220, 230, and 240 of the stimulus tree diagram 200 (FIG. 2). In other words, the stimulus program 300 (FIG. 3) is used.

It can be seen from the plot 600 of FIG. 6 that checkpointing at all the four splits 210, 220, 230, and 240 of the stimulus tree diagram 200 (FIG. 2) would help achieve the stimulus coverage goal in a minimum time (about 4,000 ms) while no checkpointing at all requires a maximum time (about 35,000 ms) to achieve the same stimulus coverage goal. It is assumed that the same computer (not shown) is used to run the three different stimulus programs (two of which are the stimulus programs 300 and 500).

In one embodiment, each of the stimuli S, A, . . . , and J of FIG. 2 can comprise a sequence of inputs (not just an input as described in the embodiments above).

In the embodiments described above, with reference to FIG. 2, the splits 210, 220, 230, and 240 are 2-way splits (i.e., splitting into two paths). In general, each split of the stimulus tree diagram 200 can be an M-way split with M being an integer greater than 1. In the embodiments described above, M=2 for all the splits. In general, the splits of the stimulus tree diagram 200 do not necessarily have the same value for M. For example, the split 210 can be a 2-way split as described above, but the split 240 can be a 3-way split.

Assume that a checkpoint is positioned at the 3-way split 240 (i.e., the split 240 is a checkpointed split), then the instruction 340 (FIG. 3) should be replaced by an instruction which when executed would place three items in the checkpoint queue 430 (FIG. 4). In response, the checkpoint manager 420 would create three testing simulation environments to execute along the three paths branching from the 3-way split 240 as described above.

Assume alternatively that no checkpoint is positioned at the 3-way split 240 (i.e., the split 240 is a non-checkpointed split), then the instruction 340 should be replaced by an instruction which when executed would randomly generate one of three possible values (e.g., 1, 2, and 3) and then follow one of the three paths corresponding to the randomly generated value.

Figure 7:
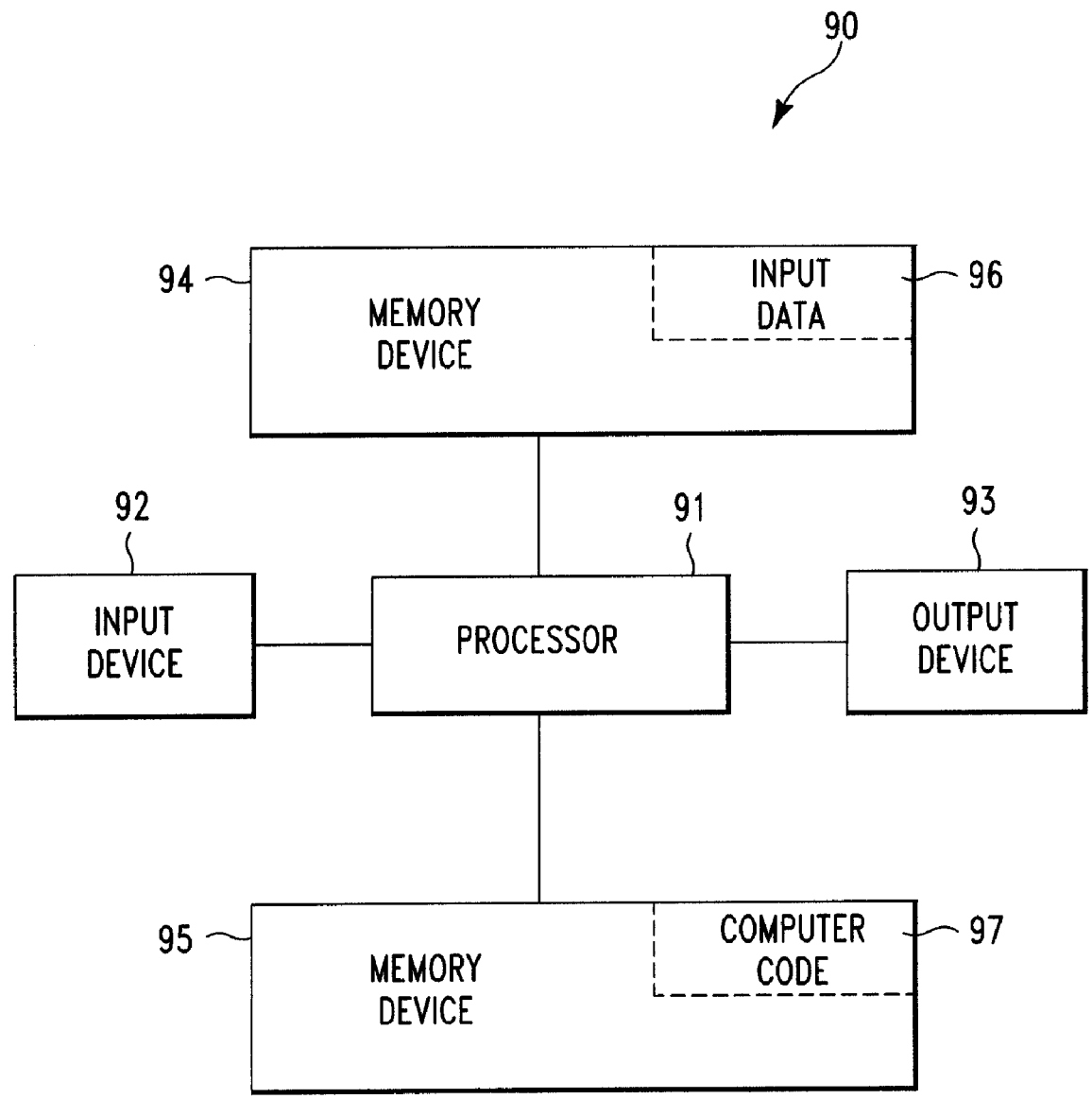
FIG. 7 illustrates a computer system for simulating the testing simulation environment of FIG. 1, in accordance with embodiments of the present invention.

FIG. 7 illustrates a computer system 90 used for verifying the circuit design 130 (FIG. 1), in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, interalia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for verifying the circuit design 130 (FIG. 1). The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 7) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

Thus the present invention discloses a process for deploying computing infrastructure, comprising integrating computer-readable code into the computer system 90, wherein the code in combination with the computer system 90 is capable of performing a method for verifying the circuit design 130 (FIG. 1).

While FIG. 7 shows the computer system 90 as a particular configuration of hardware and software, any configuration of hardware and software, as would be known to a person of ordinary skill in the art, may be utilized for the purposes stated supra in conjunction with the particular computer system 90 of FIG. 7. For example, the memory devices 94 and 95 may be portions of a single memory device rather than separate memory devices.

In the embodiments described above, the first testing simulation environment 440.1 (that executes S-A) and the second testing simulation environment 440.2 (that executes B-C-D-E) can be considered a first simulation process that executes the stimulus coverage path S-A-B-C-D-E. Similarly, the third testing simulation environment 440.3 (that executes F), the fourth testing simulation environment 440.4 (that executes G-I), and another testing simulation environment (that executes M) can be considered a second simulation process that executes the stimulus coverage path F-G-I-M (i.e., from A).

It should be noted that the second simulation process encounters two checkpointed splits right after F and I. At each of the checkpointed splits the second simulation process encounters, the second simulation process communicates with the checkpoint manager 420 (FIG. 4) as described above so that a new process can be created to explore the other path(s) of the checkpointed split. For example, right after F, the second simulation process continues to G. From the information provided by the second simulation process, the checkpoint manager 420 creates another process (i.e., the fifth testing simulation environment 440.5 described above) to go to H.

For example, right after F, the information that the second simulation process provides the checkpoint manager 420 comprises the instruction where the checkpointed split resides (i.e., the location of the checkpointed split, which is F) and the value of the remaining path (i.e., the status of the checkpointed split, which is FALSE).

The first simulation process behaves similarly to the first simulation process. It just happens that after A, the first simulation process does not encounter any checkpointed split.

In one embodiment, the checkpoint manager 420 is a part of the first simulation process. In that case, the second simulation process provides the first simulation process with information about each checkpointed split that the second simulation process encounters on its path. In other words, the first simulation process controls all simulation processes that may run sequentially or simultaneously.

It should be noted that the stimulus S is considered a random seed configuration of the circuit design 130 (FIG. 1).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A design verification method, comprising:
providing a circuit design;
creating a stimulus tree diagram for the circuit design, wherein the stimulus tree diagram comprises L stimuli, L being an integer greater than 4,
wherein the stimulus tree diagram further comprises M checkpointed splits, M being an integer greater than 1, and
wherein the stimulus tree diagram further comprises N non-checkpointed splits, N being an non-negative integer; and
executing the stimulus tree diagram, wherein said executing the stimulus tree diagram comprises, for i=1, . . . , M, executing an $i^{th}$ checkpointed split of the M checkpointed splits, wherein said executing the $i^{th}$ checkpointed split comprises:
saving an $i^{th}$ context of an $i^{th}$ simulation environment in which said executing the stimulus tree diagram is performed; and
after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

2. The method of claim 1, wherein said executing the stimulus tree diagram further comprises, for h=1, . . . , N, executing an $h^{th}$ non-checkpointed split of the N non-checkpointed splits, wherein said executing the $h^{th}$ non-checkpointed split comprises:

randomly generating a value of Qh possible values, wherein the $h^{th}$ non-checkpointed split is a Qh-way split, Qh being an integer greater than 1;

continuing execution along one path of Qh paths of the stimulus tree diagram branching from the $h^{th}$ non-checkpointed split, wherein said one path is associated with the randomly generated value.

3. The method of claim 1, wherein said executing the stimulus tree diagram further comprises, for j=1, . . . , L, executing a $j^{th}$ job, said executing the $j^{th}$ job comprising:

generating a $j^{th}$ stimulus of the L stimuli;

applying said $j^{th}$ stimulus to the circuit design;

generating a $j^{th}$ output of the circuit design in response to said $j^{th}$ stimulus being applied to the circuit design;

generating a $j^{th}$ expected value for said $j^{th}$ stimulus;

comparing said $j^{th}$ output and the $j^{th}$ expected value for said $j^{th}$ stimulus; and indicating that the circuit design is defective if said $j^{th}$ output and said $j^{th}$ expected value for said $j^{th}$ stimulus are different from each other as a result of said comparing.

4. The method of claim 3, wherein said executing the $1^{st}$, . . . , $L^{th}$ jobs are performed sequentially.

5. The method of claim 3, wherein said executing the $1^{st}$, . . . , $L^{th}$ jobs are performed non-sequentially.

6. The method of claim 1, wherein N=0.

7. The method of claim 1, wherein N>0.

8. The method of claim 1, wherein said executing the $i^{th}$ checkpointed split further comprises placing Pi items in a checkpoint queue, and wherein said executing from the $i^{th}$ context along Pi paths comprises, for k=1, . . . , Pi, executing from the $i^{th}$ context along a $k^{th}$ path of the Pi paths based on a $k^{th}$ item of the Pi items in the checkpoint queue.

9. The method of claim 8, wherein said executing from the $i^{th}$ context along the $1^{st}$, . . . , $Pi^{th}$ paths are performed sequentially.

10. The method of claim 8, wherein said executing from the $i^{th}$ context along the $1^{st}$, . . . , $Pi^{th}$ paths are performed non-sequentially.

11. The method of claim 8, wherein the each item of the Pi items in the checkpoint queue is associated one-to-one with a path of the Pi paths.

12. The method of claim 8, wherein the each item of the Pi items in the checkpoint queue is associated with the $i^{th}$ context of the $i^{th}$ simulation environment.

13. The method of claim 1, wherein said executing the stimulus tree diagram is performed by computer simulation.

14. The method of claim 1, further comprising indicating a completion of a circuit design verification in response to all stimulus coverage paths of the stimulus tree diagram having been performed.

15. A method, comprising executing an algorithm by a processor of a computer system, said algorithm being comprised by a computer code stored in a computer-readable media, said computer-readable media being coupled to the processor, said executing said algorithm comprising the step of executing a stimulus tree diagram of a circuit design, wherein the stimulus tree diagram comprises L stimuli, L being an integer greater than 4, wherein the stimulus tree diagram further comprises M checkpointed splits, M being an integer greater than 1, wherein the stimulus tree diagram further comprises N non-checkpointed splits, N being an non-negative integer, and wherein said executing the stimulus tree diagram comprises, for i=1, . . . , M, executing an $i^{th}$ checkpointed split of the M checkpointed splits, wherein said executing the $i^{th}$ checkpointed split comprises:

saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

16. The method of claim 15, wherein said step of executing the stimulus tree diagram further comprises, for j=1, . . . , L, executing a $j^{th}$ job, said executing the $j^{th}$ job comprising:

generating a $j^{th}$ stimulus of the L stimuli;

applying said $j^{th}$ stimulus to the circuit design;

generating a $j^{th}$ output of the circuit design in response to said $j^{th}$ stimulus being applied to the circuit design;

generating a $j^{th}$ expected value for said $j^{th}$ stimulus;

comparing said $j^{th}$ output and the $j^{th}$ expected value for said $j^{th}$ stimulus; and indicating that the circuit design is defective if said $j^{th}$ output and said $j^{th}$ expected value for said $j^{th}$ stimulus are different from each other as a result of said comparing.

17. The method of claim 16, wherein said executing the $1^{st}$, . . . , $L^{th}$ jobs are performed sequentially.

18. The method of claim 16, wherein said executing the $1^{st}$, . . . , $L^{th}$ jobs are performed non-sequentially.

19. The method of claim 15, wherein N=0.

20. The method of claim 15, wherein N>0.

21. A computer program product, comprising a computer usable medium having a computer readable program code embodied therein, said computer readable program code comprising an algorithm adapted to implement a method for circuit design verification, said method comprising the step of executing a stimulus tree diagram of a circuit design, wherein the stimulus tree diagram comprises L stimuli, L being an integer greater than 4, wherein the stimulus tree diagram further comprises M checkpointed splits, M being an integer greater than 1, wherein the stimulus tree diagram further comprises N non-checkpointed splits, N being an non-negative integer, and wherein said executing the stimulus tree diagram comprises, for i=1, . . . , M, executing an $i^{th}$ checkpointed split of the M checkpointed splits, wherein said executing the $i^{th}$ checkpointed split comprises:

saving an $i^{th}$ context of an $i^{th}$ simulation environment in which said executing the stimulus tree diagram is performed; and after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

22. The method of claim 21, wherein said step of executing the stimulus tree diagram further comprises, for j=1, . . . , L, executing a $j^{th}$ job, said executing the $j^{th}$ job comprising:

generating a $j^{th}$ stimulus of the L stimuli;

applying said $j^{th}$ stimulus to the circuit design;

generating a $j^{th}$ output of the circuit design in response to said $j^{th}$ stimulus being applied to the circuit design;

generating a $j^{th}$ expected value for said $j^{th}$ stimulus;
comparing said $j^{th}$ output and the $j^{th}$ expected value for said $j^{th}$ stimulus; and
indicating that the circuit design is defective if said $j^{th}$ output and said $j^{th}$ expected value for said $j^{th}$ stimulus are different from each other as a result of said comparing.

23. The method of claim 22, wherein said executing the $1^{st}, \ldots, L^{th}$ jobs are performed sequentially.

24. The method of claim 22, wherein said executing the $1^{st}, \ldots, L^{th}$ jobs are performed non-sequentially.

25. The method of claim 21, wherein N=0.

26. A method for circuit design verification, comprising integrating computer-readable code into a computing system, wherein the code in combination with the computing system is capable of performing the step of executing a stimulus tree diagram of a circuit design,
wherein the stimulus tree diagram comprises L stimuli, L being an integer greater than 4,
wherein the stimulus tree diagram further comprises M checkpointed splits, M being an integer greater than 1,
wherein the stimulus tree diagram further comprises N non-checkpointed splits, N being an non-negative integer, and
wherein said executing the stimulus tree diagram comprises, for i=1, ..., M, executing an $i^{th}$ checkpointed split of the M checkpointed splits, wherein said executing the $i^{th}$ checkpointed split comprises:
saving an $i^{th}$ context of an $i^{th}$ simulation environment in which said executing the stimulus tree diagram is performed; and
after said saving the $i^{th}$ context is performed, executing from the $i^{th}$ context along Pi paths of the stimulus tree diagram branching from the $i^{th}$ checkpointed split, wherein the $i^{th}$ checkpointed split is a Pi-way split, Pi being an integer greater than 1.

27. The method of claim 26, wherein said step of executing the stimulus tree diagram further comprises, for j=1, ..., L, executing a $j^{th}$ job, said executing the $j^{th}$ job comprising:
generating a $j^{th}$ stimulus of the L stimuli;
applying said $j^{th}$ stimulus to the circuit design;
generating a $j^{th}$ output of the circuit design in response to said $j^{th}$ stimulus being applied to the circuit design;
generating a $j^{th}$ expected value for said $j^{th}$ stimulus;
comparing said $j^{th}$ output and the $j^{th}$ expected value for said $j^{th}$ stimulus; and
indicating that the circuit design is defective if said $j^{th}$ output and said $j^{th}$ expected value for said $j^{th}$ stimulus are different from each other as a result of said comparing.

28. The method of claim 27, wherein said executing the $1^{st}, \ldots, L^{th}$ jobs are performed sequentially.

29. The method of claim 27, wherein said executing the $1^{st}, \ldots, L^{th}$ jobs are performed non-sequentially.

30. The method of claim 26, wherein N=0.

31. A method of testing an integrated circuit using a concurrent simulation process, the method comprising:
defining a test coverage for the integrated circuit;
creating a first simulation process from a random seed configuration of the integrated circuit, the first simulation process controlling the concurrent simulation process;
running the first simulation process to a first checkpointed split of the test coverage;
running a second simulation process concurrently with the first simulation process, the second simulation process starting at the first checkpointed split;
continuing the first simulation process to a first plurality of checkpointed splits until all stimuli on a coverage path of the test coverage have been exercised;
continuing the second simulation process to a second plurality of checkpointed splits until all stimuli on a coverage path of the test coverage have been exercised; and
communicating a status and a location of each one of the first plurality of checkpointed splits and the second plurality of checkpointed splits to the first simulation process.

32. The method of claim 31, further comprising distributing a simulation workload across a plurality of computer systems.

33. The method of claim 31, wherein the second plurality of checkpointed splits comprises at least a second checkpointed split.

34. The method of claim 33, further comprising running a third simulation process concurrently with the second simulation process, the third simulation process starting at the second checkpointed split.

* * * * *